(12) United States Patent
Kato

(10) Patent No.: US 6,340,902 B1
(45) Date of Patent: Jan. 22, 2002

(54) SEMICONDUCTOR DEVICE HAVING MULTIPLE POWER-SUPPLY NODES AND CAPABLE OF SELF-DETECTING POWER-OFF TO PREVENT ERRONEOUS OPERATION

(75) Inventor: Hiroshi Kato, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/516,780

(22) Filed: Mar. 1, 2000

(30) Foreign Application Priority Data

Aug. 12, 1999 (JP) ............................. 11-228393

(51) Int. Cl.[7] ................................................. H03K 5/22
(52) U.S. Cl. ........................................................ 327/77
(58) Field of Search .............................. 327/77, 80, 81, 327/85, 88, 89

(56) References Cited

U.S. PATENT DOCUMENTS 4,617,473 A * 10/1986 Bingham ..................... 307/66
5,475,332 A * 12/1995 Ishimoto ..................... 327/427
5,510,735 A * 4/1996 Mahabadi ..................... 327/77
5,872,737 A 2/1999 Tsuruda et al. ........ 365/189.05
5,973,521 A * 10/1999 Kim et al. ................... 327/112

FOREIGN PATENT DOCUMENTS

| JP | 4-285437 | 10/1992 |
| JP | 6-140499 | 5/1994 |
| JP | 10-290526 | 10/1998 |

* cited by examiner

Primary Examiner—Jeffrey Zweizig
(74) Attorney, Agent, or Firm—McDermott, Will & Emery

(57) ABSTRACT

A potential detection portion generates from a power-supply potential of 3.3V a reference potential Vref lower than 1.5V, and compares reference potential Vref with a potential of a power-supply line of a 1.5V system to detect a power-off. An output of potential detection portion is provided to a gate of an N-channel MOS transistor via a level conversion circuit. N-channel MOS transistor fixes an output of an internal circuit that operates by a power supply of the 1.5V system.

15 Claims, 13 Drawing Sheets

SEMICONDUCTOR DEVICE HAVING MULTIPLE POWER-SUPPLY NODES AND CAPABLE OF SELF-DETECTING POWER-OFF TO PREVENT ERRONEOUS OPERATION

BACKGROUND OF THE INVENTION

1. Field of the Invention

The present invention relates to a semiconductor device, and more specifically, to a semiconductor device having a plurality of power-supply nodes.

2. Description of the Background Art

Today, further reduction in power consumption in a semiconductor device is required. Particularly, a low voltage, low power operation in a stand-by mode is essential in a device such as portable equipment that is battery-driven.

As an example, let us consider a semiconductor device driven by two power supplies in which power-supply voltages of 3.3V and 2.5V, for example, are provided from outside. In this case, as a way of reducing the power consumption, the semiconductor device is formed such that an internal circuit that is not in operation in a stand-by mode is provided with a power supply of 2.5V, while a circuit that is required to be in operation even in the stand-by mode is supplied with 3.3V. Thus, the power consumption in a stand-by mode can be reduced by having the supply of 2.5V power supply potential stopped in the stand-by mode.

When stopping the supply of 2.5V power-supply potential, however, if the state of each node for the internal circuit driven by 2.5V is not taken into account, an input node for the internal circuit of the 3.3V system operating in the stand-by mode may enter a floating state, or the indefinite state, thereby causing an erroneous operation of the semiconductor device. Especially in a CMOS circuitry, there are many circuits with an arrangement that allows a large through current to flow steadily when an input node reaches an intermediate potential.

As a solution to this problem, a detection signal indicating that the supply of 2.5V power-supply potential is stopped may be provided from outside, and an internal circuit that operates according to this signal and provides a fixed potential to a node may also be provided so as to fix the potential of the node that needs to be fixed in order to prevent an erroneous operation.

The power consumption of the entire system in a stand-by mode, however, is not readily reduced when a circuit for detecting a power-supply potential is provided outside the semiconductor device, because a detection circuit needs to be in operation ready for the next power-on even while the supply of 2.5V power-supply potential is stopped.

SUMMARY OF THE INVENTION

An object of the present invention is to provide a semiconductor device capable of recognizing a power-off without relying on an external signal, and fixing the potential of a node that needs to be fixed, thereby preventing an erroneous operation when the supply of one of the two systems of power-supply potentials is stopped.

In short, the present invention is a semiconductor device provided with a first power-supply line, a first internal circuit, a second power-supply line, and a second internal circuit.

The first power-supply line is provided to transmit a first power-supply potential. The first internal circuit receives and operates by the first power-supply potential from the first power-supply line to output a first main signal to a first internal node. The second power-supply line is provided to transmit a second power-supply potential. The second internal circuit receives and operates by a second power-supply potential from the second power-supply line. The second internal circuit includes a third internal circuit that monitors the potential of the first power-supply line and outputs a first sub signal that decides the potential of the first internal node instead of the first main signal that becomes indefinite upon the detection of a power-off.

Thus, the main advantage of the present invention is that problems such as an erroneous operation and data disruption can be prevented while a stable operation is ensured, since the semiconductor device itself can recognize the power-off without relying on an external signal and provides a potential to the node that becomes unstable when the supply of one of the two systems of power-supply potentials is stopped.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
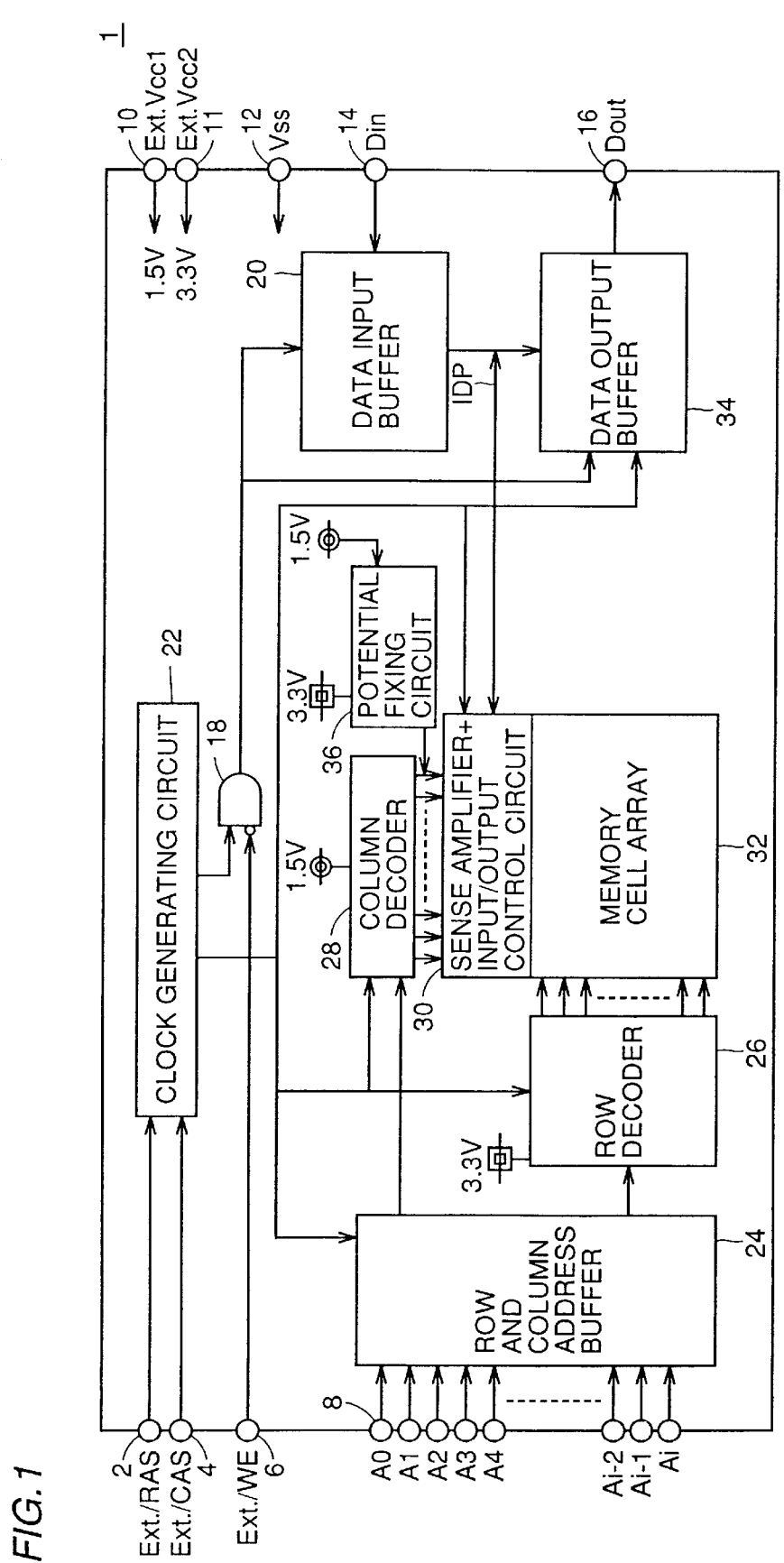
FIG. 1 is a schematic block diagram representing an arrangement of a semiconductor device 1 according to a first embodiment of the present invention.

The embodiments of the present invention will be described in detail below with reference to the drawings. Throughout the drawings, the same reference characters designate the same or corresponding parts.

First Embodiment

FIG. 1 is a schematic block diagram representing an arrangement of a semiconductor device 1 according to a first embodiment of the present invention.

As shown in FIG. 1, a semiconductor device 1 is provided with control signal input terminals 2 to 6 for receiving control signals Ext./RAS, Ext./CAS, and Ext./WE, respectively; an address input terminal group 8; an input terminal 14 for inputting a data signal Din; an output terminal 16 for outputting a data signal Dout; a ground terminal 12 to which a ground potential Vss is provided; a power-supply terminal 10 to which a 1.5V power-supply potential Ext.Vcc1 is provided; and a power-supply terminal 11 to which a 3.3V power-supply potential Ext.Vcc2 is provided.

Semiconductor device 1 is further provided with a clock generating circuit 22, a row and column address buffer 24, a row decoder 26, a column decoder 28, a sense amplifier+input/output control circuit 30, a memory cell array 32, a gate circuit 18, a data input buffer 20, and a data output buffer 34.

Clock generating circuit 22 generates a control clock corresponding to a prescribed operation mode based on an external row address strobe signal Ext./RAS and an external column address strobe signal Ext./CAS provided from outside via control signal input terminals 2 and 4 to control the operation of the entire semiconductor device.

Row and column address buffer 24 provides row decoder 26 and column decoder 28 with an address signal generated based on externally provided address signals A0 to Ai (i is a natural number).

A memory cell in memory cell array 32 designated by row decoder 26 and column decoder 28 communicates data with outside through an input terminal Din or an output terminal Dout via sense amplifier+input/output control circuit 30 and data input buffer 20 or data output buffer 34.

A power-supply potential of 3.3V is supplied to row decoder 26. A power-supply potential of 1.5V is supplied to column decoder 28.

Semiconductor device 1 is further provided with a potential fixing circuit 36 to which a power-supply potential of 3.3V is supplied as an operation power-supply potential and which monitors the supplied 1.5V power-supply potential and fixes the potential of an internal node that needs to be fixed.

Semiconductor device 1 shown in FIG. 1 is a representative example. The present invention is applicable to a synchronous semiconductor memory device (SDRAM), a logic LSI, a microprocessor, and the like.

Figure 2:
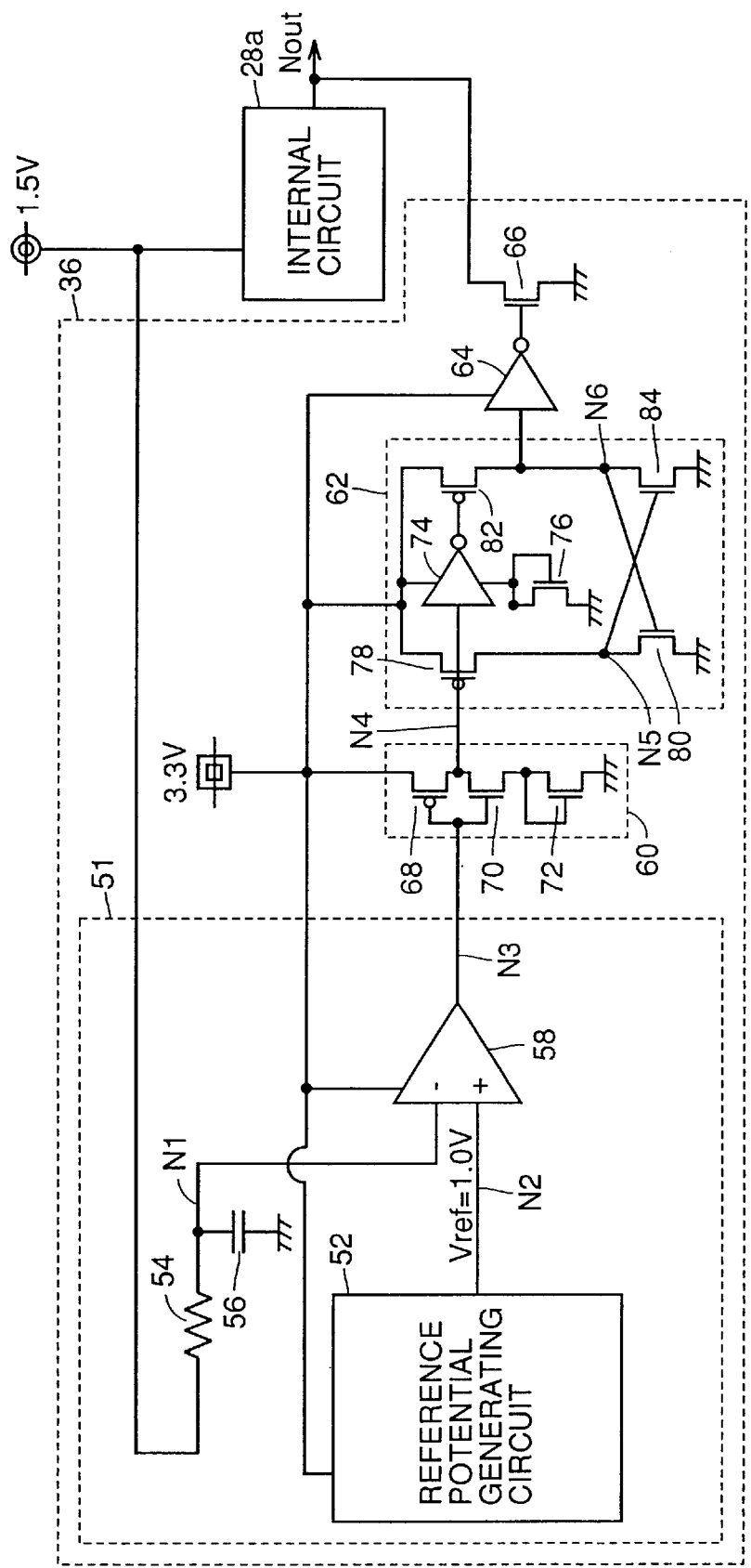
FIG. 2 is a circuit diagram representing an arrangement of a potential fixing circuit 36 in FIG. 1.

FIG. 2 is a circuit diagram representing an arrangement of a potential fixing circuit 36 in FIG. 1.

As shown in FIG. 2, potential fixing circuit 36 includes a potential detection portion 51 for detecting a power-off of a 1.5V system, an inverter 60 for receiving and inverting an output of potential detection portion 51, a level conversion circuit 62 for amplifying an output amplitude of inverter 60, an inverter 64 for receiving and inverting an output of level conversion circuit 62, and an N-channel MOS transistor 66 connected between a node Nout and a ground node for receiving at a gate an output from inverter 64. Node Nout is an output node of an internal circuit 28a driven by a 1.5V system power supply.

Potential detection portion 51 includes a reference potential generating circuit 52 for receiving a power-supply potential of 3.3V to output a reference potential Vref of 1.0V to a node N2; a low-pass filter formed by a resistance 54 connected between a power-supply node to which a power-supply potential of 1.5V is provided and a node N1, and a capacitor 56 connected between node N1 and a ground node; and a comparing circuit 58 having a positive input node connected to node N2 and having a negative input node connected to node N1, and operating by a power-supply potential of 3.3V. Comparing circuit 58 outputs a detection result from potential detection portion 51 to a node N3.

Inverter 60 includes a P-channel MOS transistor 68 having a source coupled to a 3.3V power-supply potential, a drain connected to a node N4, and a gate connected to node N3; an N-channel MOS transistor 70 having a gate connected to node N3 and a drain connected to node N4; and a diode-connected N-channel MOS transistor 72 with the forward direction being from the source of N-channel MOS transistor 70 to a ground node.

Level conversion circuit 62 includes an inverter 74 having an input connected to node N4; a P-channel MOS transistor 78 connected between a node N5 and a power-supply node to which a power-supply potential of 3.3V is provided and having a gate connected to node N4; and an N-channel MOS transistor 80 connected between node N5 and a ground node and having a gate connected to a node N6.

Level conversion circuit 62 further includes a P-channel MOS transistor 82 connected between node N6 and a power-supply node to which a power-supply potential of 3.3V is provided and having a gate connected to an output of inverter 74, and an N-channel MOS transistor 84 connected between node N6 and a ground node and having a gate connected to node N5.

Level conversion circuit 62 further includes an N-channel MOS transistor 76. Inverter 74 receives a power-supply potential of 3.3V as an operation power-supply potential, and is connected to a ground node via N-channel MOS transistor 76 diode-connected in the forward direction.

A power-supply potential supplied to potential fixing circuit 36, reference potential generating circuit 52, comparing circuit 58, inverters 60 and 64, and level conversion circuit 62 is provided via a power-supply line from the same source to that supplying a power-supply potential of 3.3V.

Potential fixing circuit 36 is a fixing circuit employed when the supply of only the lower of the two power-supply potentials is stopped. A power-supply potential of 3.3V is constantly provided so that potential fixing circuit 36 itself is driven by the power-supply potential of 3.3V.

Figure 3:
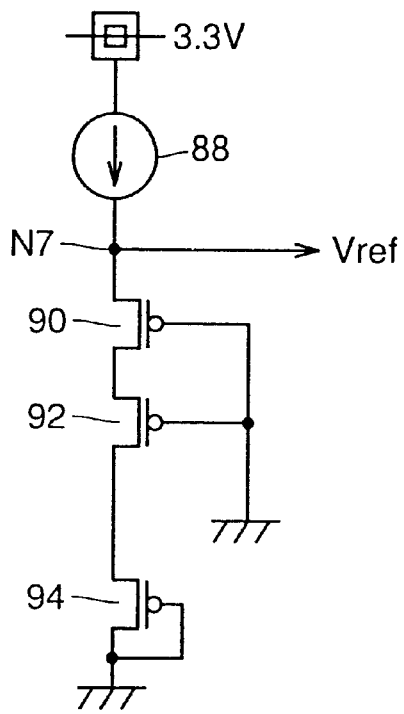
FIG. 3 is a circuit diagram representing a circuit arrangement of a reference potential generating circuit 52 in FIG. 2.

FIG. 3 is a circuit diagram representing a circuit arrangement of a reference potential generating circuit 52 in FIG. 2.

As shown in FIG. 3, reference potential generating circuit 52 includes a constant-current source 88 that conducts a constant current from a power-supply node to which a power-supply potential of 3.3V is provided toward a node N7, and a P-channel MOS transistors 90 to 94 connected in series between node N7 and a ground node. The gates of P-channel MOS transistors 90 to 94 are connected to the ground nodes. A reference potential Vref is output from node N7. The number of series-connected P-channel MOS transistors is increased or decreased according to a desired value of reference potential.

Figure 4:
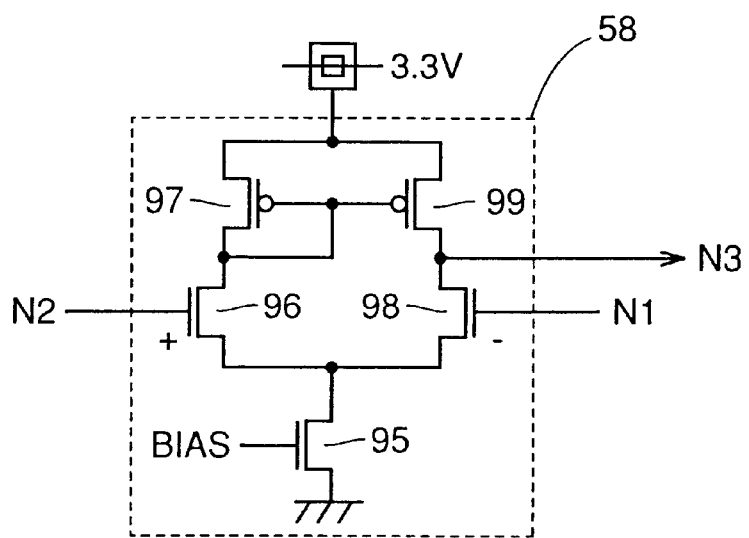
FIG. 4 is a circuit diagram representing a circuit arrangement of a comparing circuit 58 in FIG. 2.

FIG. 4 is a circuit diagram representing a circuit arrangement of a comparing circuit 58 in FIG. 2.

As shown in FIG. 4, comparing circuit 58 includes an N-channel MOS transistor 95 receiving at a gate a signal BIAS having a prescribed fixed potential level and having a source connected to a ground node, an N-channel MOS transistor 96 having a gate connected to node N2 and a source connected to a drain of N-channel MOS transistor 95, and a P-channel MOS transistor 97 having a source coupled to a power-supply potential of 3.3V and a gate and a drain connected to a drain of N-channel MOS transistor 96.

Comparing circuit 58 further includes an N-channel MOS transistor 98 connected between a drain of N-channel MOS transistor 95 and a node N3 and having a gate connected to node N1, and a P-channel MOS transistor 99 having a source coupled to a power-supply potential of 3.3V, a drain connected to node N3, and a gate connected to a drain of N-channel MOS transistor 96. Node N3 is an output node of comparing circuit 58.

Such a comparing circuit includes N-channel MOS transistor 95 as a transistor for limiting the current. The potential of node N3 is slightly higher than the ground potential when a logic low or "L" level is output from node N3. Accordingly, level conversion circuit 62 shown in FIG. 2 is employed to set the "L" level potential to a ground potential. The operation of level conversion circuit 62 allows N-channel MOS transistor 66 to switch properly between the conductive and non-conductive states.

Figure 5:
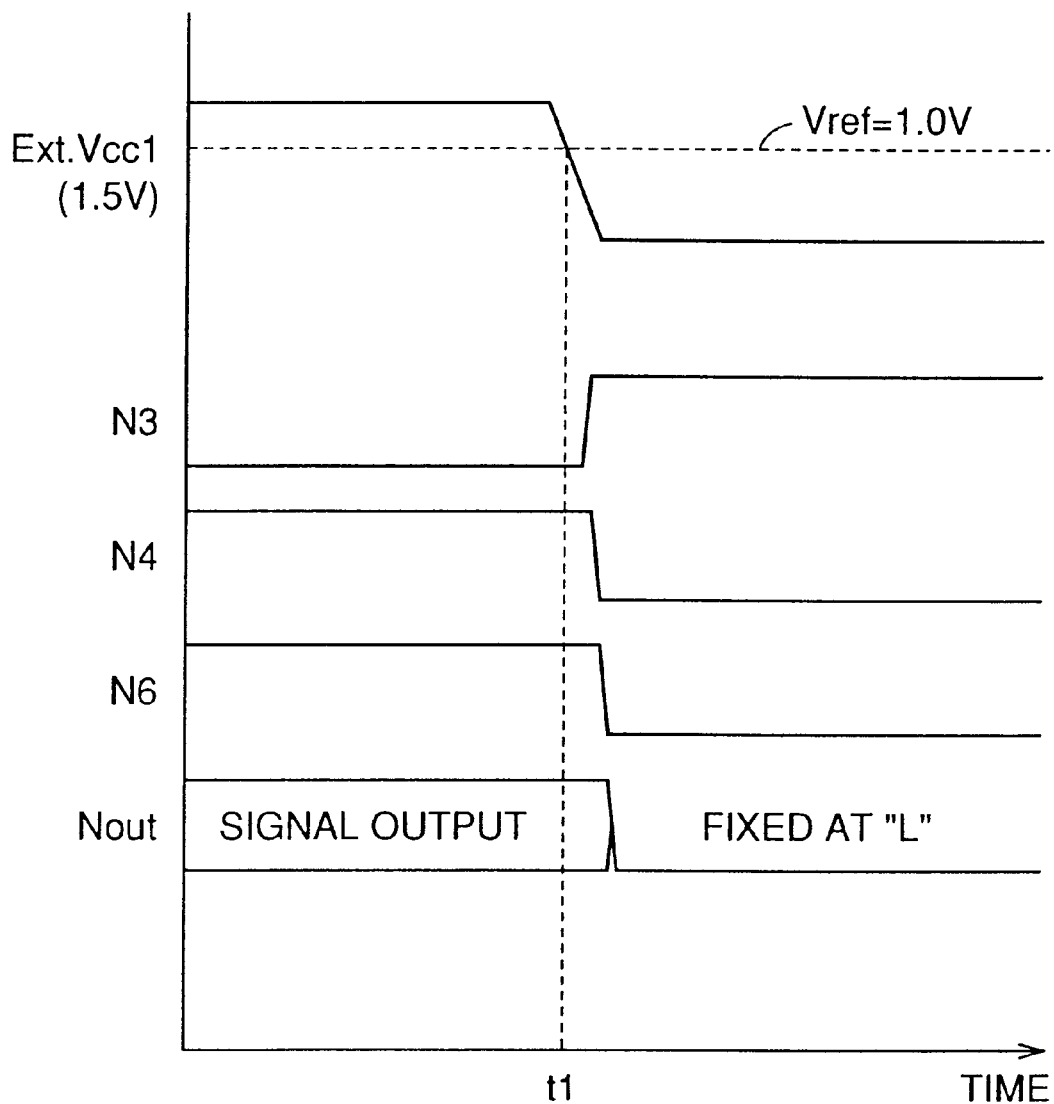
FIG. 5 is an operation waveform chart in relation to the description of an operation of potential fixing circuit 36.

FIG. 5 is an operation waveform chart in relation to the description of an operation of potential fixing circuit 36.

As shown in FIGS. 2 and 5, an external power-supply potential Ext.Vcc1 of the 1.5V system is supplied prior to time t1. As a result, the potentials of nodes N3, N4, and N6 are at the "L," "H" (or logic high), and "H" levels, respectively. Internal circuit 28a is in operation, and a node Nout is in a normal operation state, fluctuating in an AC-like manner between the "H" level and the "L" level states.

When external power-supply potential Ext.Vcc1 falls below reference potential Vref of 1.0V due to a power-off at time t1, potential detection portion 51 provides its output to node N3. Accordingly, nodes N3, N4, and N6 attain the "H," "L," and "L" levels, respectively. Since no power-supply potential is provided, internal circuit 28a does not provide a signal to node Nout. Thus, N-channel MOS transistor 66 is rendered conductive, thereby fixing node Nout at the "L" level.

An example will be described below in which such a potential fixing circuit 36 is suitably employed.

Once again, as shown in FIG. 1, semiconductor device 1 is a semiconductor memory device provided with a memory cell array. Let us consider a situation in which an external power-supply potential of 1.5V is cut off in a self-refresh mode. Here, the circuitry (row-related circuitry) that operates even in the self-refresh mode is formed with an arrangement that receives a power-supply potential of 3.3V as an operation power-supply potential.

Since no column operation is performed in the self-refresh mode, a column select line CSL, for example, should be fixed at all times to the "L" level.

A driver circuit that drives column select line CSL, however, receives the supply of the drive current from a power-supply potential of 1.5V. When the power-supply potential of 1.5V is cut off, the potential of column select line CSL driven by the driver circuit may possible fluctuate unstably around an intermediate potential.

Thus, when the power-supply potential of 1.5V is cut off, data stored in a memory cell could be disrupted if a node is not fixed to a fixed potential, for example at the "L" level.

An example of an application to another part will be shown below.

Figure 6:
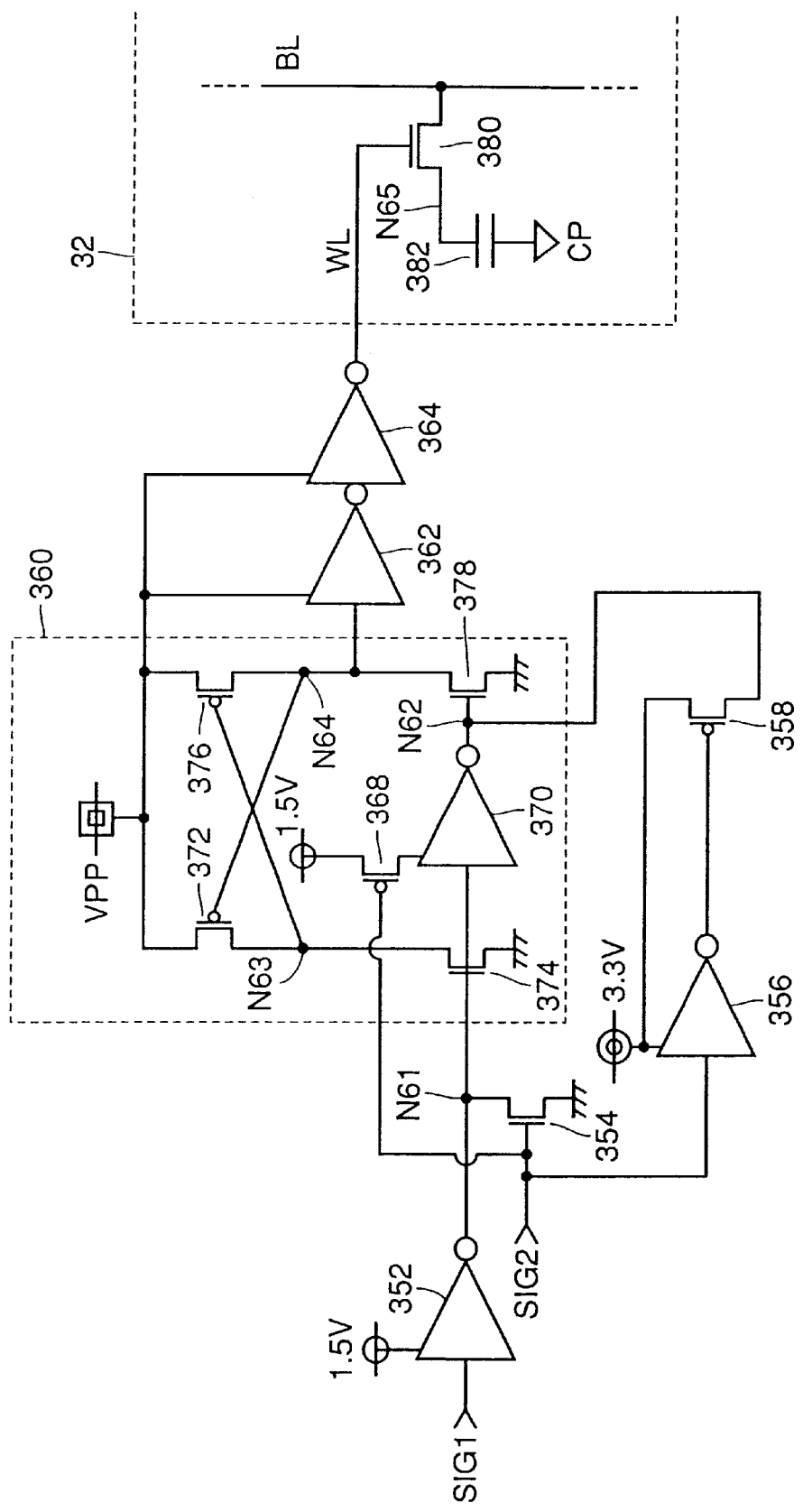
FIG. 6 is a circuit diagram showing a word line driving system when the first embodiment is applied.

A drive circuit provided to an output portion of row decoder 26 shown in FIG. 1 for driving a word line inside memory cell array 32 is shown in FIG. 6.

The drive circuit includes an inverter 352 that receives the supply of an operation power-supply potential from an external power supply of 1.5V and that receives a signal SIG1 and outputs an inverted output to a node N61, an N-channel MOS transistor 354 connected between node N61 and a ground node for receiving at a gate a signal SIG2, an inverter 356 that receives the supply of an operation power-supply potential from an external power supply of 3.3V and that receives and inverts signal SIG2, and a P-channel MOS transistor 358 connected between a node N62 and a node to which an external power-supply potential of 3.3V is provided for receiving at a gate an output from inverter 356.

The drive circuit further includes a level conversion circuit 360 for level-converting the "H" level of an output from inverter 352 into a boosted potential Vpp, and inverters 362 and 364 connected in series for receiving an output from level conversion circuit 360 and for receiving the supply of an operation power-supply potential from boosted potential Vpp. Inverter 364 drives a word line WL.

Memory cell array 32 includes a plurality of bit lines, a plurality of N-channel MOS transistors, and a plurality of memory cells. An N-channel MOS transistor 380 and a capacitor 382 connected in series between a bit line BL and a cell plate CP are representatively shown. Word line WL is connected to a gate of N-channel MOS transistor 380.

Level conversion circuit 360 includes a P-channel MOS transistor 372 connected between a boosting node to which boosted potential Vpp is provided and a node N63 and having a gate connected to a node N64, an N-channel MOS transistor 374 connected between node N63 and a ground node and having a gate connected to node N6 1, an inverter 370 having an input connected to node N61 for providing an inverted output to node N62, and a P-channel MOS transistor 368 for providing to inverter 370 a power-supply potential of 1.5V as an operation power-supply potential according to signal SIG2.

Level conversion circuit 360 further includes a P-channel MOS transistor 376 connected between node N64 and a boosting node to which boosted potential Vpp is provided and having a gate connected to node N63, and an N-channel MOS transistor 378 connected between node N64 and a ground node and having a gate connected to node N62.

In such a circuit arrangement, when a power-supply potential of 1.5V is not provided from outside in a stand-by mode or the like, the potentials of the outputs from inverters 352 and 370 become unstable. N-channel MOS transistor 354 and P-channel MOS transistor 358 are thus provided to fix the unstable potentials. By setting signal SIG2 at the "H" level in a stand-by mode or the like, the potentials of nodes N61 and N62 can be fixed. Signal SIG2 is set to the "H" level when the power-off of the 1.5V power-supply potential is detected as described in relation to FIG. 2.

Thus, by fixing the potential of a node during a power-off by a potential fixing circuit as the one shown in the first embodiment, problems such as an erroneous operation and the disruption of data can be prevented and a stable operation is ensured.

Second Embodiment

A semiconductor device according to the second embodiment differs from the first embodiment in that the supply of the higher of the two input power-supply potentials is stopped in a stand-by mode or the like.

Figure 7:
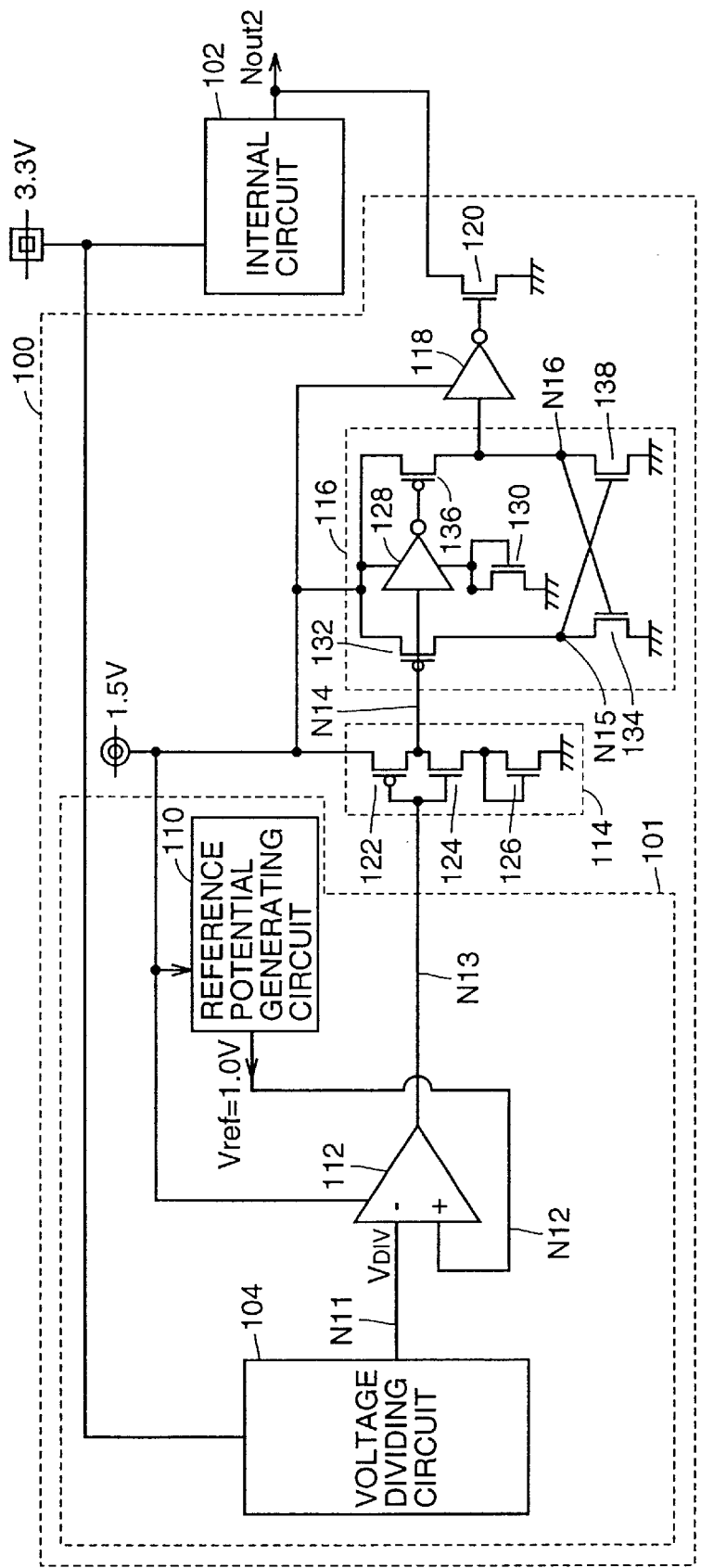
FIG. 7 is a circuit diagram representing an arrangement of a potential fixing circuit 100 used in a semiconductor device according to a second embodiment.

FIG. 7 is a circuit diagram representing an arrangement of a potential fixing circuit 100 used in a semiconductor device according to a second embodiment.

As shown in FIG. 7, potential fixing circuit 100 includes a potential detection portion 101 for detecting a power-off of a 3.3V system, an inverter 114 for receiving and inverting an output of potential detection portion 101, a level conversion circuit 116 for amplifying an output amplitude of inverter 114, an inverter 118 for receiving and inverting an output of level conversion circuit 116, and an N-channel MOS transistor 120 connected between a node Nout2 and a ground node for receiving at a gate an output from inverter 118. Node Nout2 is an output node of an internal circuit 102 driven by a 3.3V system power supply.

Potential detection portion 101 includes a reference potential generating circuit 110 for receiving a power-supply potential of 1.5V to output a reference potential Vref of 1.0V to a node N12; a voltage dividing circuit 104 for receiving a power-supply potential of 3.3V from outside to output a voltage-divided potential $V_{DIV}$ to a node N11; and a comparing circuit 112 having a positive input node connected to node N12 and having a negative input node connected to node N11, and operating by a power-supply potential of 1.5V. Comparing circuit 112 outputs a detection result from potential detection portion 101 to a node N13.

Inverter 114 includes a P-channel MOS transistor 122 having a source coupled to a 1.5V power-supply potential, a drain connected to a node N14, and a gate connected to node N13; an N-channel MOS transistor 124 having a gate connected to node N13 and a drain connected to node N14; and a diode-connected N-channel MOS transistor 126 with the forward direction being from the source of N-channel MOS transistor 124 to a ground node.

Level conversion circuit 116 includes an inverter 128 having an input connected to node N14; a P-channel MOS transistor 132 connected between a node N15 and a power-supply node to which a power-supply potential of 1.5V is provided and having a gate connected to node N14; and an N-channel MOS transistor 134 connected between node N15 and a ground node and having a gate connected to a node N16.

Level conversion circuit 116 further includes a P-channel MOS transistor 136 connected between node N16 and a power-supply node to which a power-supply potential of 1.5V is provided and having a gate connected to an output of inverter 128, and an N-channel MOS transistor 138 connected between node N16 and a ground node and having a gate connected to node N15.

Level conversion circuit 116 further includes an N-channel MOS transistor 130. Inverter 128 receives a power-supply potential of 1.5V as an operation power-supply potential, and is connected to a ground node via N-channel MOS transistor 130 diode-connected in the forward direction.

Potential fixing circuit 100 is a fixing circuit used when the supply of the higher of the two power-supply potentials is stopped.

A power-supply potential supplied to reference potential generating circuit 110, comparing circuit 112, inverter 114, level conversion circuit 116, and inverter 118 all included in potential fixing circuit 100 is provided via a power-supply line from the same source of 1.5V.

The power-supply potential supplied to internal circuit 102 and voltage dividing circuit 104 is provided via a power-supply line from the same source of 3.3V.

Figure 8:
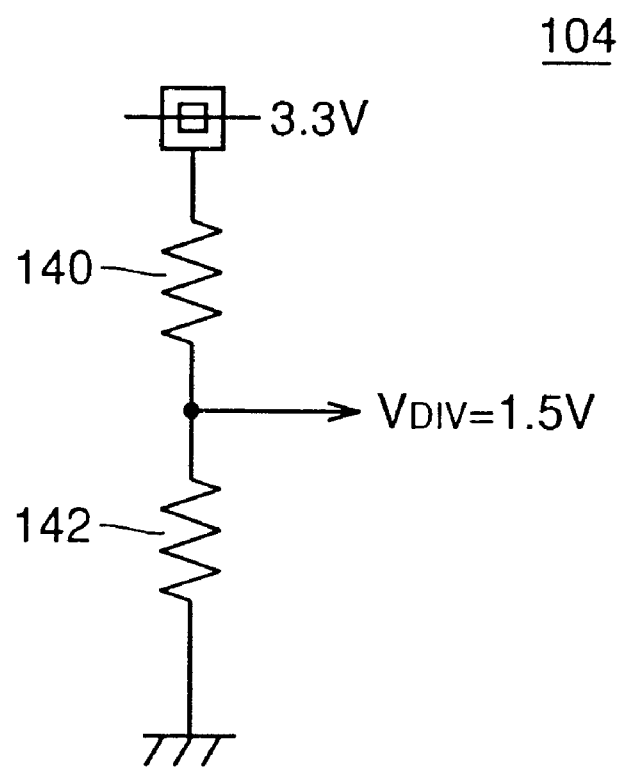
FIG. 8 is a circuit diagram representing an arrangement of a voltage dividing circuit 104 shown in FIG. 7.

FIG. 8 is a circuit diagram representing an arrangement of a voltage dividing circuit 104 shown in FIG. 7.

As shown in FIG. 8, voltage dividing circuit 104 includes resistances 140 and 142 connected in series between a ground node and a power-supply node to which a power-supply potential of 3.3V is provided from outside. Voltage-divided potential $V_{DIV}$ is output from a node connecting resistances 140 and 142.

The resistance ratio of resistance 140 and resistance 142 is set at a value that allows a voltage-divided potential $V_{DIV}$ of 1.5V to be output.

Figure 9:
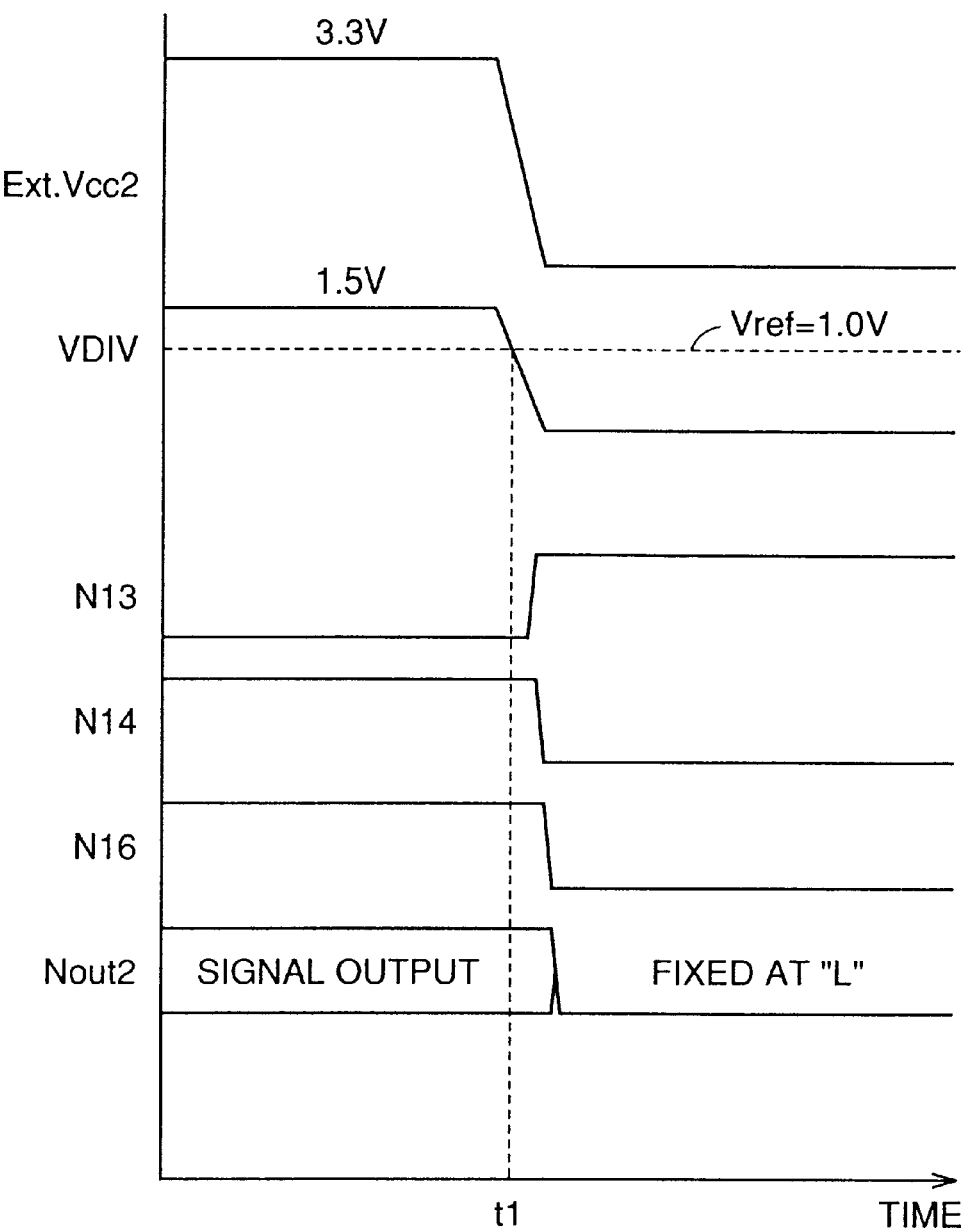
FIG. 9 is an operation waveform chart in relation to the description of an operation of potential fixing circuit 100.

FIG. 9 is an operation waveform chart in relation to the description of an operation of potential fixing circuit 100.

As shown in FIGS. 7 and 9, an external power-supply potential of the 3.3V system is supplied prior to time t1. As a result, voltage-divided potential $V_{DIV}$ is 1.5V. Consequently, the potentials of nodes N13, N14, and N16 are at the "L," "H," and "H" levels, respectively. Internal circuit 102 is in operation, and a node Nout2 is in a normal operation state, fluctuating in an AC-like manner between the "H" level and the "L" level states.

When an external power-supply potential of the 3.3V system falls due to a power-off at time t1, voltage-divided potential $V_{DIV}$ falls accordingly. When voltage-divided potential $V_{DIV}$ becomes lower than reference potential Vref of 1.0V, potential detection portion 101 provides an output to node N13. Consequently, nodes N13, N14, and N16 attain the "H," "L," and "L" levels, respectively. Since no power-supply potential is provided, internal circuit 102 does not provide a signal to node Nout2. Thus, N-channel MOS transistor 120 is rendered conductive, thereby fixing node Nout2 at the "L" level.

Let us assume, for instance, a situation in which a power-supply potential of 3.3V is supplied to a DRAM (Dynamic Random Access Memory) and a power-supply potential of 1.5V is supplied to a logic circuit in a semiconductor device having a DRAM merged with a logic circuit. In such a case, depending on the system arrangement in which the semiconductor device is employed, it may not be necessary for a DRAM to be in operation, for example, in a stand-by mode or the like. In this case, the higher power-supply potential of 3.3V may preferably be turned off to reduce the power consumption.

By employing an arrangement as the one shown in the second embodiment, problems such as an erroneous operation and the disruption of data can be prevented even when the higher of the two power-supply potentials provided from outside is cut off in a stand-by mode or the like.

Third Embodiment

A semiconductor device according to the third embodiment differs from the first embodiment in that the supply of either one of the two systems of input power-supply potentials that are equal is stopped.

An example in which two systems of input power-supply potentials VccA and VccB, both at 3.3V, will be described using the drawings.

Figure 10:
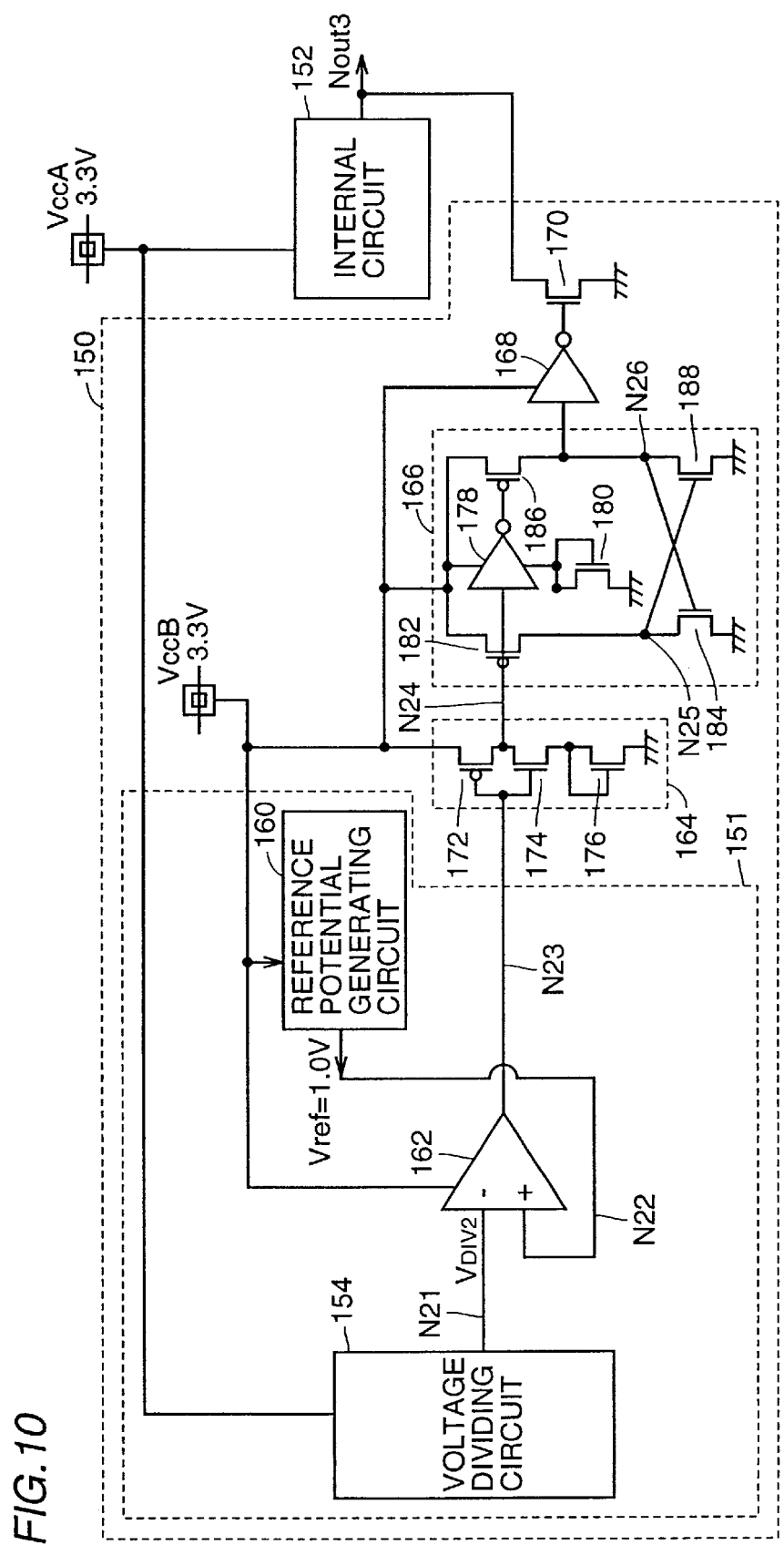
FIG. 10 is a circuit diagram representing an arrangement of a potential fixing circuit 150 used in a semiconductor device according to a third embodiment.

FIG. 10 is a circuit diagram representing an arrangement of a potential fixing circuit 150 used in a semiconductor device according to a third embodiment.

As shown in FIG. 10, potential fixing circuit 150 includes a potential detection portion 151 for detecting a power-off of a 3.3V system, an inverter 164 for receiving and inverting an output of potential detection portion 151, a level conversion circuit 166 for amplifying an output amplitude of inverter 164, an inverter 168 for receiving and inverting an output of level conversion circuit 166, and an N-channel MOS transistor 170 connected between a node Nout3 and a ground node for receiving at a gate an output from inverter 168. Node Nout3 is an output node of an internal circuit 152 driven by a VccA system power supply of 3.3V.

Potential detection portion 151 includes a reference potential generating circuit 160 for receiving power-supply potential VccB of 3.3V to output a reference potential Vref of 1.0V to a node N22; a voltage dividing circuit 154 for receiving a power-supply potential VccA of 3.3V to output a voltage-divided potential $V_{DIV2}$ to a node N21; and a comparing circuit 162 having a positive input node connected to node N22 and having a negative input node connected to node N21, and receiving and operating by VccB as a power-supply potential. Comparing circuit 162 outputs a detection result from potential detection portion 151 to a node N23.

Inverter 164 includes a P-channel MOS transistor 172 having a source coupled to power-supply potential VccB, a drain connected to a node N24, and a gate connected to node N23; an N-channel MOS transistor 174 having a gate connected to node N23 and a drain connected to node N24; and a diode-connected N-channel MOS transistor 176 with the forward direction being from the source of N-channel MOS transistor 174 to a ground node.

Level conversion circuit 166 includes an inverter 178 having an input connected to node N24; a P-channel MOS transistor 182 connected between a node N25 and a power-supply node to which power-supply potential VccB is provided and having a gate connected to node N24; and an N-channel MOS transistor 184 connected between node N25 and a ground node and having a gate connected to a node N26.

Level conversion circuit 166 further includes a P-channel MOS transistor 186 connected between node N26 and a power-supply node to which power-supply potential VccB is provided and having a gate connected to an output of inverter 178, and an N-channel MOS transistor 188 connected between node N26 and a ground node and having a gate connected to node N25.

Level conversion circuit 166 further includes an N-channel MOS transistor 180. Inverter 178 receives power-supply potential VccB as an operation power-supply potential, and is connected to a ground node via N-channel MOS transistor 180 diode-connected in the forward direction.

Potential fixing circuit 150 operates using power-supply potential VccB of 3.3V as a power supply. In FIG. 10, power-supply potential VccB supplied to reference potential generating circuit 160, comparing circuit 162, inverters 164 and 168, and level conversion circuit 166 is provided via a power-supply line from the same source of 3.3V.

The power-supply potential supplied to internal circuit 152 and voltage dividing circuit 154 is provided via a power-supply line from the same source to that supplying VccA.

Potential fixing circuit 150 is a fixing circuit utilized when the supply of power-supply potential VccA is stopped. Moreover, when either one of power-supply potentials VccA and VccB could be cut off, i.e. when the one to be turned off is not decided, a circuit with power-supply potentials VccA and VccB in FIG. 10 interchanged would be mounted in addition to the circuit shown in FIG. 10.

Figure 11:
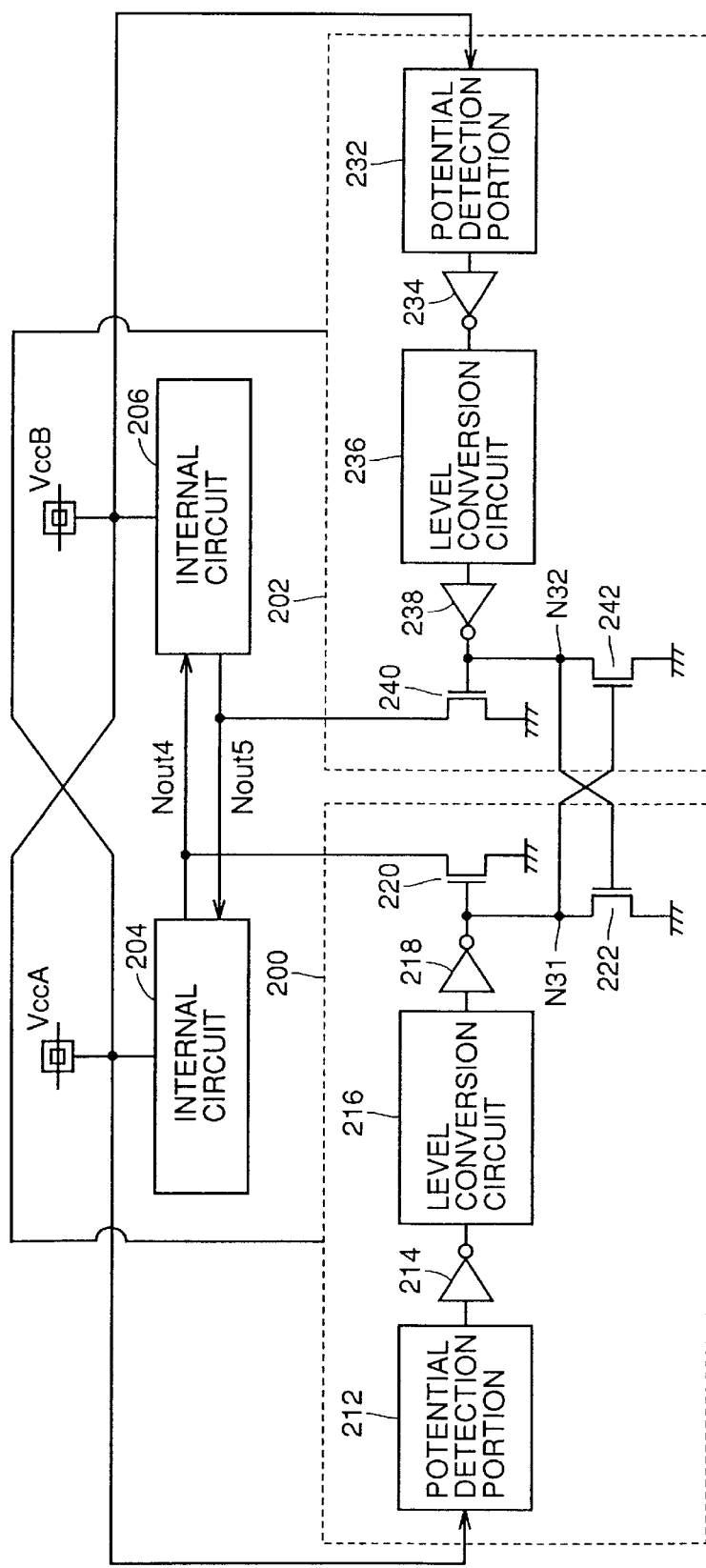
FIG. 11 is a circuit diagram representing a variation of the third embodiment.

FIG. 11 is a circuit diagram representing a variation of the third embodiment.

As shown in FIG. 11, potential fixing circuit 200 detects a fall of power-supply potential VccA and fixes an output of an internal circuit 204 operating by VccA to the "L" level.

Potential fixing circuit 202 detects a fall of power-supply potential VccB and fixes an output of an internal circuit 206 operating by VccB to the "L" level.

Potential fixing circuit 200 includes a potential detection portion 212 for detecting a fall of power-supply potential VccA, an inverter 214 for receiving and inverting an output of potential detection portion 212, a level conversion circuit 216 for amplifying an output amplitude of inverter 214, an inverter 218 for receiving and inverting an output of level conversion circuit 216, and an N-channel MOS transistor 220 connected between a node Nout4 and a ground node for receiving at a gate an output from inverter 218. Node Nout4 is an output node of internal circuit 204 driven by a power supply of power-supply potential VccA system of 3.3V.

Potential fixing circuit 200 further includes an N-channel MOS transistor 222 being connected between a ground node and a node N31 which is an output node of inverter 218 and having a gate connected to a node N32, for, power fixing circuit 200 being a circuit of the power-supply potential VccB system, it is required to fix the potential of an output node that becomes unstable when power-supply potential VccB is lowered due to a power-off.

Potential detection portion 212, inverter 214, and level conversion circuit 216 respectively have the same circuit arrangements as potential detection portion 151, inverter 164, and level conversion circuit 166 shown in FIG. 10 so that the related descriptions will not be repeated.

Potential fixing circuit 202 includes a potential detection portion 232 for detecting a fall of power-supply potential VccB, an inverter 234 for receiving and inverting an output of potential detection portion 232, a level conversion circuit 236 for amplifying an output amplitude of inverter 234, an inverter 238 for receiving and inverting an output of level conversion circuit 236, and an N-channel MOS transistor 240 connected between a node Nout5 and a ground node for receiving at a gate an output from inverter 238. Node Nout5 is an output node of internal circuit 206 driven by a power supply of power-supply potential VccB system of 3.3V.

Potential fixing circuit 202 further includes an N-channel MOS transistor 242 being connected between a ground node and a node N32 which is an output node of inverter 238 and having a gate connected to a node N31, for, power fixing circuit 202 being a circuit of the power-supply potential VccA system, it is required to fix the potential of an output node that becomes unstable when power-supply potential VccA is lowered due to a power-off.

Potential detection portion 232, inverter 234, and level conversion circuit 236 respectively have the same circuit arrangements as potential detection portion 151, inverter 164, and level conversion circuit 166 shown in FIG. 10 so that the related descriptions will not be repeated.

Thus, the potential detection portion operating by power-supply potential VccB detects the lowering of power-supply potential VccA due to a power-off, while the potential detection portion operating by power-supply potential VccA detects the lowering of power-supply potential VccB. In this manner, in either case, the semiconductor device itself detects the power-off and fixes the potential of the node the needs to be fixed.

With the above arrangement, problems such as an erroneous operation and the disruption of data can be prevented even when either one of the two systems of equal power-supply potentials provided from outside is to be turned off in a stand-by mode or the like.

Fourth Embodiment

An example in which the potential fixing circuit of the first embodiment and the potential fixing circuit of the second embodiment are both provided will be described in relation to the fourth embodiment.

Figure 12:
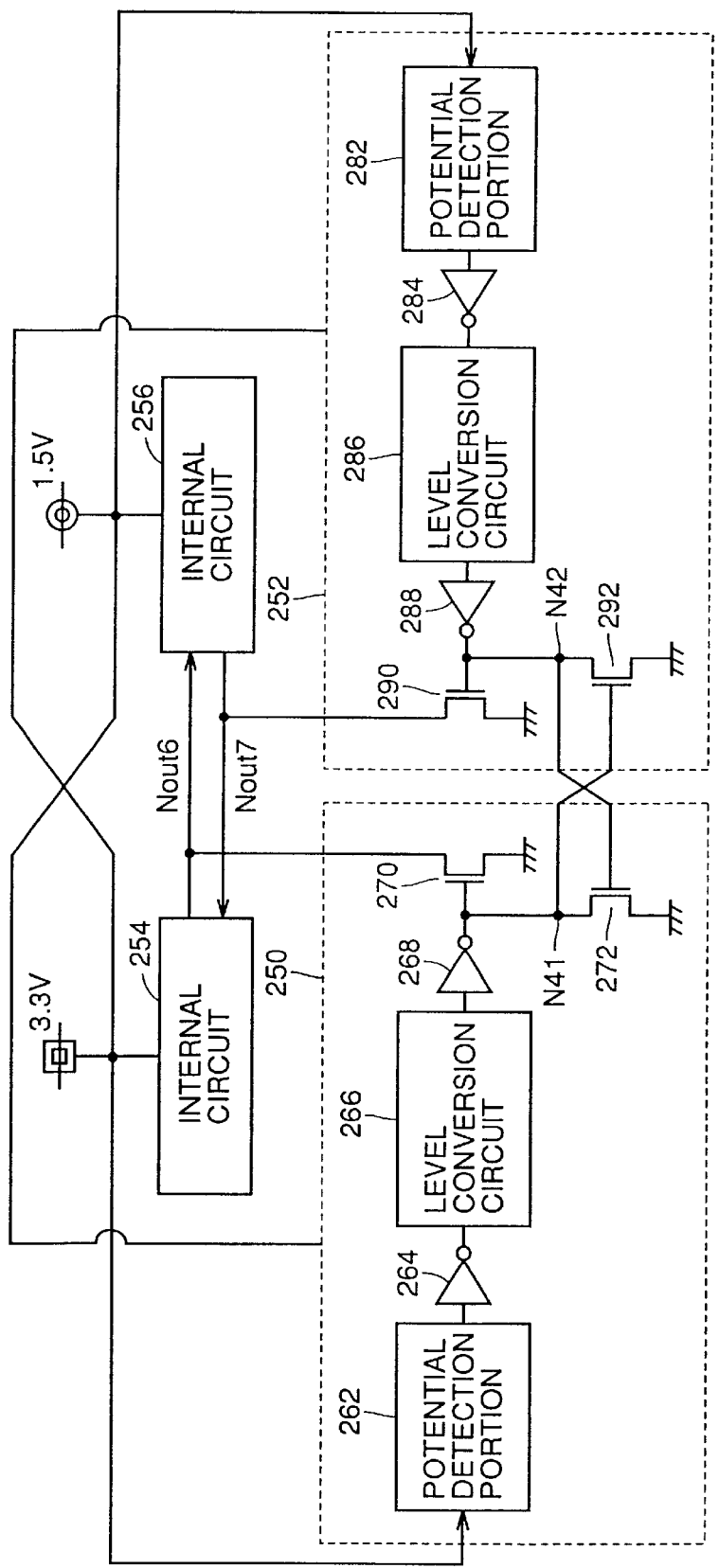
FIG. 12 is a block diagram representing the connection in a potential fixing circuit used in a semiconductor device according to a fourth embodiment.

FIG. 12 is a block diagram representing the connection in a potential fixing circuit used in a semiconductor device according to a fourth embodiment.

As shown in FIG. 12, potential fixing circuit 250 detects a fall of a power-supply potential of 3.3V and fixes an output of an internal circuit 254 operating by the power-supply potential of 3.3V to the "L" level.

Potential fixing circuit 252 detects a fall of a power-supply potential of 1.5V and fixes an output of an internal circuit 256 operating by power-supply potential of 1.5V to the "L" level.

Potential fixing circuit 250 includes a potential detection portion 262 for detecting a fall of a power-supply potential of 3.3V, an inverter 264 for receiving and inverting an output of potential detection portion 262, a level conversion circuit 266 for amplifying an output amplitude of inverter 264, an inverter 268 for receiving and inverting an output of level conversion circuit 266, and an N-channel MOS transistor 270 connected between a node Nout6 and a ground node for receiving at a gate an output from inverter 268. Node Nout6 is an output node of internal circuit 254 driven by a power supply of power-supply potential system of 3.3V.

Potential fixing circuit 250 further includes an N-channel MOS transistor 272 being connected between a ground node and a node N41 which is an output node of inverter 268 and having a gate connected to a node N42, for, power fixing circuit 250 being a circuit of the power-supply potential system of 1.5V, it is required to fix the potential of an output node that becomes unstable when a power-supply potential of 1.5V is lowered due to a power-off.

Potential detection portion 262, inverter 264, and level conversion circuit 266 respectively have the same circuit arrangements as potential detection portion 101, inverter 114, and level conversion circuit 116 shown in FIG. 7 so that the related descriptions will not be repeated.

Potential fixing circuit 252 includes a potential detection portion 282 for detecting a fall of a power-supply potential of 1.5V, an inverter 284 for receiving and inverting an output of potential detection portion 282, a level conversion circuit 286 for amplifying an output amplitude of inverter 284, an inverter 288 for receiving and inverting an output of level conversion circuit 286, and an N-channel MOS transistor 290 connected between a node Nout7 and a ground node for receiving at a gate an output from inverter 288. Node Nout7 is an output node of internal circuit 256 driven by a power supply of power-supply potential system of 1.5V.

Potential fixing circuit 252 further includes an N-channel MOS transistor 292 being connected between a ground node and a node N42 which is an output node of inverter 288 and having a gate connected to a node N41, for, power fixing circuit 252 being a circuit of the power-supply potential system of 3.3V, it is required to fix the potential of an output node that becomes unstable when a power-supply potential of 3.3V is lowered due to a power-off.

Potential detection portion 282, inverter 284, and level conversion circuit 286 respectively have the same circuit arrangements as potential detection portion 51, inverter 60, and level conversion circuit 62 shown in FIG. 2 so that the related descriptions will not be repeated.

With the above-described arrangement, a device can be implemented which detects the condition of a power-off of either the higher or the lower power-supply potential of the two systems of power supplies to prevent an erroneous operation.

Fifth Embodiment

Figure 13:
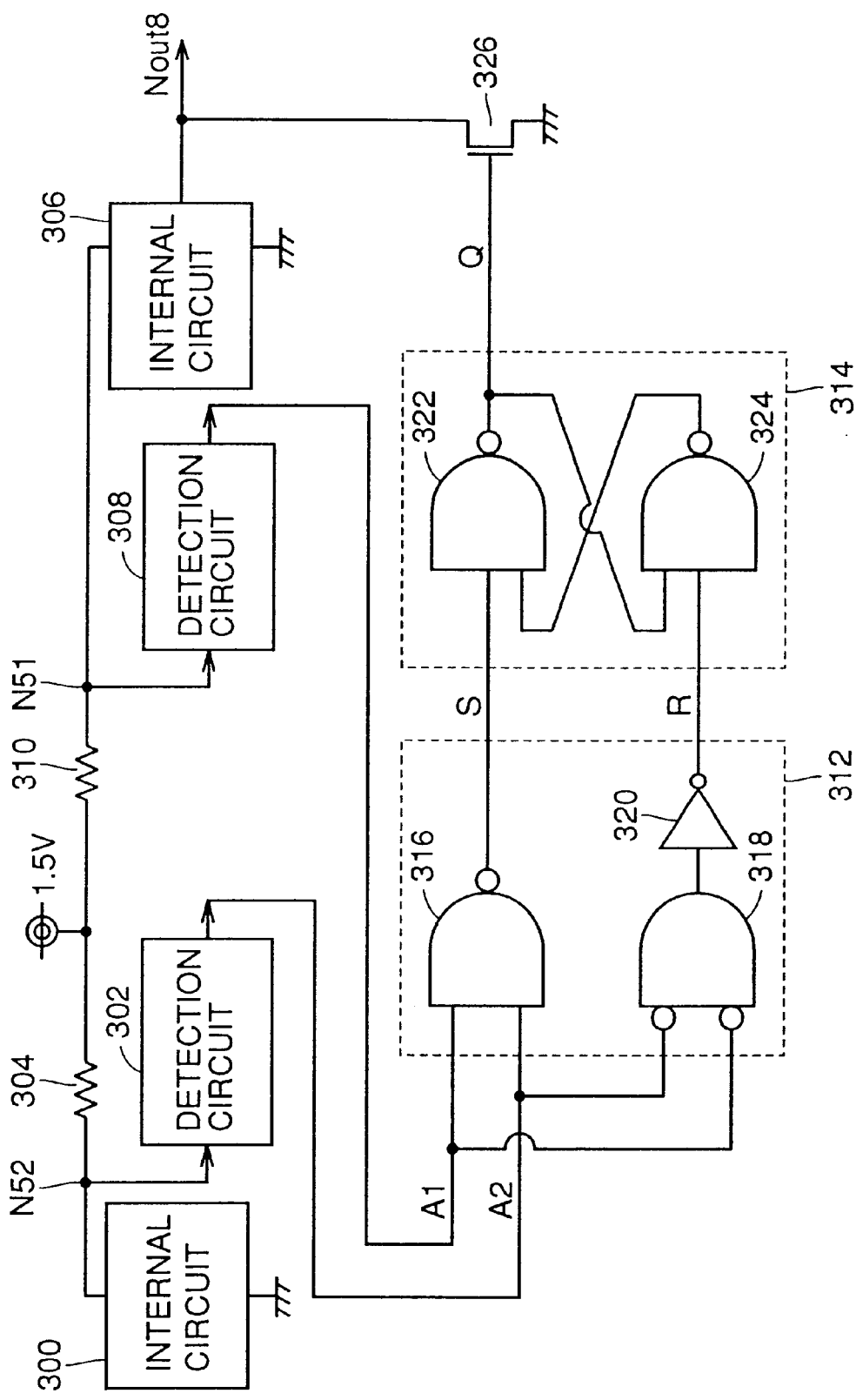
FIG. 13 is a circuit diagram representing an arrangement of a power-off detection circuit of a fifth embodiment.

FIG. 13 is a circuit diagram representing an arrangement of a power-off detection circuit of a fifth embodiment.

As shown in FIG. 13, a semiconductor device according to the fifth embodiment includes internal circuits 300 and 306 that receive and operate by a power-supply potential of 1.5V.

Internal circuit 300 has a power-supply node connected to a node N52. A power-supply potential of 1.5V is provided to node N52 from outside via an internal line which has a resistance component as shown by a resistance 304.

Internal circuit 306 has a power-supply node connected to a node N51. A power-supply potential of 1.5V is provided to node N51 from outside via an internal line which has a resistance component as shown by a resistance 310.

The potential of node N52 is determined by the value of the current consumed in internal circuit 300 and a resistance value of resistance 304. The potential of node N51 is determined by the value of the current consumed in internal circuit 306 and a resistance value of resistance 310. Therefore, the lowering of the potential does not necessarily occur in the same manner at nodes N51 and N52.

The semiconductor device further includes a detection circuit 302 for detecting the lowering of the potential of node N52 to output a signal A2, a detection circuit 308 for detecting the lowering of the potential of node N51 to output a signal A1, a determination circuit 312 for receiving signals A1 and A2 to determine whether a power-off has occurred, a latch circuit 314 for receiving and holding outputs of determination circuit 312, and an N-channel MOS transistor 326 for fixing a node Nout 8 which is an output node of internal circuit 306 to the "L" level according to an output from latch circuit 314.

Detection circuits 302 and 308, determination circuit 312, and latch circuit 314 are driven by a power-supply potential, not shown, provided separately from the power-supply potential of 1.5V provided to internal circuits 300 and 306.

Determination circuit 312 includes an NAND circuit 316 for receiving signals A1 and A2 at inputs to output a signal S, an NOR circuit 318 for receiving signals A1 and A2 at inputs, and an inverter 320 for receiving and inverting an output of NOR circuit 318 to output a signal R.

Latch circuit 314 includes an NAND circuit 322 for receiving signal S at one input to output a signal Q, and an NAND circuit 324 for receiving signals Q and R at inputs. An output of NAND circuit 324 is provided to the other input of NAND circuit 322.

Signal Q is provided to a gate of N-channel MOS transistor 326 and sets node Nout 8 to the "L" level when activated.

Figure 14:
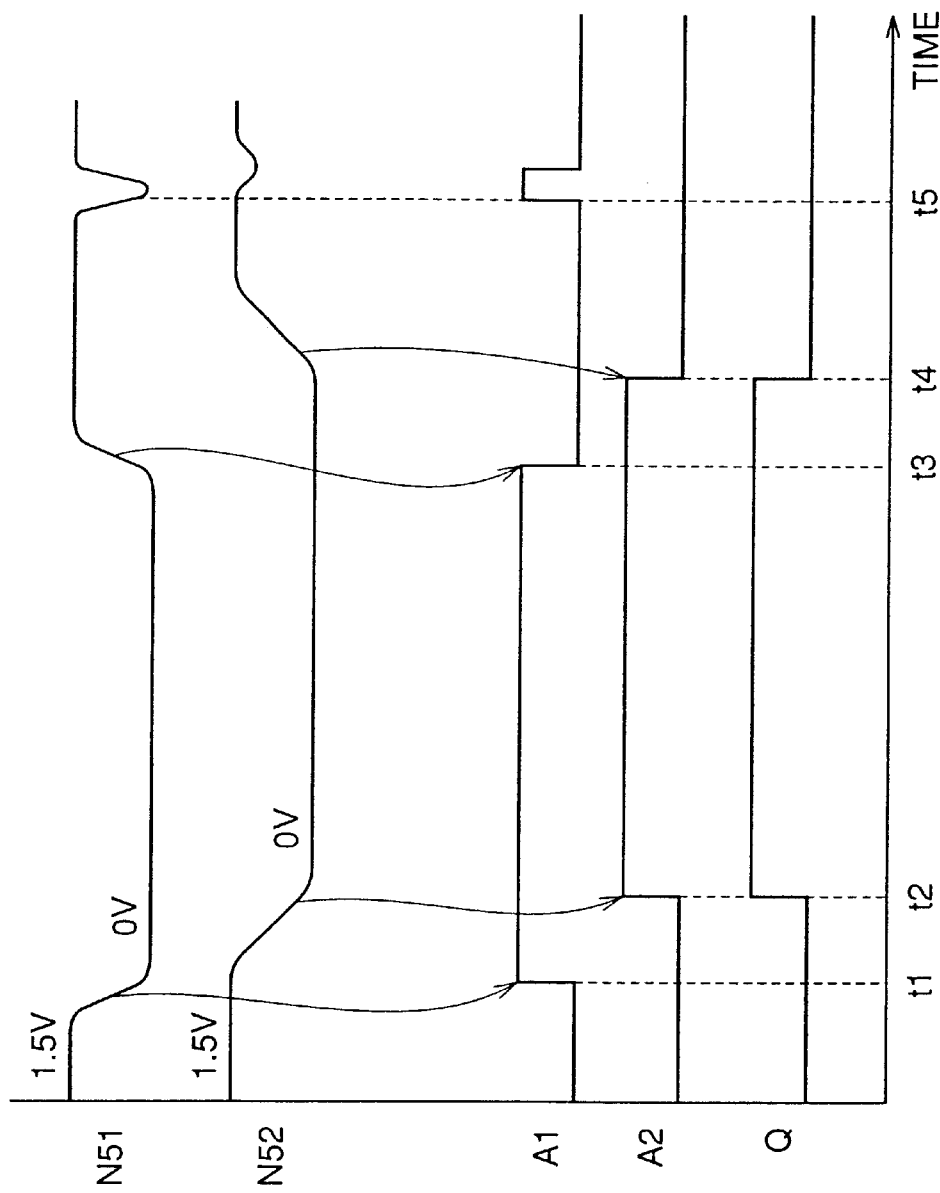
FIG. 14 is an operation waveform chart in relation to the description of an operation of a circuit shown in FIG. 13.

FIG. 14 is an operation waveform chart in relation to the description of an operation of a circuit shown in FIG. 13.

Now, reference is made to FIGS. 13 and 14. At time t1, when the potential of node N51 becomes lower than a reference potential inside detection circuit 308, signal A1 rises from the "L" level to the "H" level. Since signal A2 has not attained the "H" level yet, however, determination circuit 312 does not output signal S so that signal Q is still at the "L" level. Therefore, node Nout8 is not fixed.

When the potential of node N52 becomes lower than the reference potential inside detection circuit 302 at time t2, signal A2 rises from the "L" level to the "H" level. Since signals A1 and A2 both have attained the "H" level, determination circuit 312 determines that a power-off has occurred, signal Q attains the "H" level, and N-channel MOS transistor 326 is rendered conductive, thereby fixing node Nout8 at the "L" level.

The respective potentials of nodes N51 and N52 change at difference speeds at the time of power-off due to the following factors: the difference in the resistance values of resistances 304 and 310, the difference in the current consumption by internal circuits 300 and 306, the difference in the capacitances of the stabilizing capacitors, etc.

When the power supply of 1.5V is turned on again, the potential of node N51 becomes higher than the reference potential inside detection circuit 308 at time t3 so that signal A1 falls from the "H" level to the "L" level. Since signal A2 has not attained the "L" level yet, however, determination circuit 312 does not output the signal R so that signal Q is still at the "H" level. Thus, the potential of node Nout8 remains fixed.

When the potential of node N52 becomes higher than the reference potential inside detection circuit 302 at time t4, signal A2 falls from the "H" level to the "L" level. Since signals A1 and A2 both have attained the "L" level, determination circuit 312 determines that the power supply has been restored. Signal Q attains the "L" level, and N-channel MOS transistor 326 is rendered non-conductive, thereby releasing the fixed potential of node Nout8.

Now, the case of an instantaneous drop of the power supply will be described.

Due to the instantaneous drop at time t5, the potential of node N51 becomes lower than the reference potential inside detection circuit 308, resulting in a change in signal A1. Even in such a case, no change occurs in signal A2 since the fall in potential of node N52 has been insignificant and the potential has quickly recovered. In this case, the data held in latch circuit 314 is not changed since the outputs of determination circuit 312 do not change.

As described above, by detecting a change in a power-supply potential at several nodes, such an erroneous operation can be prevented as a potential fixing circuit responding to an instantaneous drop in a power supply and erroneously fixing the potential of an internal node.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a first power-supply line provided to transmit a first power-supply potential;
   a first internal circuit receiving and operating with said first power-supply potential from said first power-supply line for outputting a fluctuating logic signal to a first internal node;
   a second power-supply line provided to transmit a second power-supply potential; and
   a second internal circuit receiving and operating with said second power-supply potential from said second power-supply line, wherein
   said second internal circuit includes
      a third internal circuit for monitoring a potential of said first power-supply line to detect a power-off of said first power supply line and outputting a first sub signal that decides a potential of said first internal node instead of said fluctuating logic signal that becomes indefinite upon the power-off of said first power-supply line.

2. The semiconductor device according to claim 1, wherein said third internal circuit includes
   a first potential detection portion for monitoring the potential of said first power-supply line to detect the power-off of said first power-supply line, and
   a first switching circuit rendered conductive according to an output of said first potential detection portion for transmitting a prescribed fixed potential as said first sub signal to said first internal node.

3. The semiconductor device according to claim 2, wherein said first switching circuit includes
   a first MOS transistor having one end connected to said first internal node and another end coupled to said fixed potential, and having a gate receiving a potential controlled according to the output of said first potential detection portion.

4. The semiconductor device according to claim 3, wherein said third internal circuit further includes
   a level conversion circuit for level-converting the output of said first potential detection portion to output either one of a first gate potential rendering said first MOS transistor conductive and a second gate potential rendering said first MOS transistor non-conductive.

5. The semiconductor device according to claim 2, wherein
   said second power-supply potential is provided from outside, and
   said first power-supply potential is provided from outside separately from said second power-supply potential and is lower than said second power-supply potential.

6. The semiconductor device according to claim 5, wherein said first potential detection portion includes
   a reference potential generating circuit for generating from said second power-supply potential a reference potential lower than said first power-supply potential, and
   a comparing circuit for comparing the potential of said first power-supply line with said reference potential.

7. The semiconductor device according to claim 2, wherein
   said second power-supply potential is provided from outside, and
   said first power-supply potential is provided from outside separately from said second power-supply potential and is higher than said second power-supply potential.

8. A semiconductor device, comprising:
   a first power-supply line provided to transmit a first power-supply potential;
   a first internal circuit receiving and operating with said first power-supply potential from said first power-supply line for outputting a first main signal to a first internal node;
   a second power-supply line provided to transmit a second power-supply potential; and
   a second internal circuit receiving and operating with said second power-supply potential from said second power-supply line, wherein
   said second internal circuit includes
      a third internal circuit for monitoring a potential of said first power-supply line to detect a power-off of said first power supply line and outputting a first sub signal that decides a potential of said first internal node instead of said first main signal that becomes indefinite upon the power-off of said first power-supply line; and includes
      a first potential detection portion for monitoring the potential of said first power-supply line to detect the power-off of said first power-supply line, and
      a first switching circuit rendered conductive according to an output of said first potential detection portion for transmitting a prescribed fixed potential as said first sub signal to said first internal node; wherein said second power-supply potential is provided from outside, and said first power-supply potential is provided from outside separately from said second power-supply potential and is higher than said second power-supply potential; and wherein said first potential detection portion includes a voltage dividing circuit for dividing and thus lowering the potential of said first power-supply line to output a voltage-divided potential, a reference potential generating circuit for generating from said second power-supply potential a reference potential lower than said voltage-divided potential while said first power-supply potential is provided to said first power-supply line, and a comparing circuit for comparing said voltage-divided potential and said reference potential.

9. The semiconductor device according to claim 2, wherein said second power-supply potential is provided from outside, and said first power-supply potential is provided from outside separately from said second power-supply potential and is equal to said second power-supply potential.

10. A semiconductor device, comprising:

a first power-supply line provided to transmit a first power-supply potential;

a first internal circuit receiving and operating with said first power-supply potential from said first power-supply line for outputting a first main signal to a first internal node;

a second power-supply line provided to transmit a second power-supply potential; and a second internal circuit receiving and operating with said second power-supply potential from said second power-supply line, wherein said second internal circuit includes a third internal circuit for monitoring a potential of said first power-supply line to detect a power-off of said first power supply line and outputting a first sub signal that decides a potential of said first internal node instead of said first main signal that becomes indefinite upon the power-off of said first power-supply line; and includes a first potential detection portion for monitoring the potential of said first power-supply line to detect the power-off of said first power-supply line, and a first switching circuit rendered conductive according to an output of said first potential detection portion for transmitting a prescribed fixed potential as said first sub signal to said first internal node; wherein said second power-supply potential is provided from outside, and said first power-supply potential is provided from outside separately from said second power-supply potential and is equal to said second power-supply potential, and wherein said first potential detection portion includes a voltage dividing circuit for dividing and thus lowering the potential of said first power-supply line to output a voltage-divided potential, a reference potential generating circuit for generating from said second power-supply potential a reference potential lower than said voltage-divided potential while said first power-supply potential is provided to said first power-supply line, and a comparing circuit for comparing said voltage-divided potential and said reference potential.

11. A semiconductor device, comprising:

a first power-supply line provided to transmit a first power-supply potential;

a first internal circuit receiving and operating with said first power-supply potential from said first power-supply line for outputting a first main signal to a first internal node;

a second power-supply line provided to transmit a second power-supply potential; and a second internal circuit receiving and operating with said second power-supply potential from said second power-supply line, wherein said second internal circuit includes a third internal circuit for monitoring a potential of said first power-supply line to detect a power-off of said first power supply line and outputting a first sub signal that decides a potential of said first internal node instead of said first main signal that becomes indefinite upon the power-off of said first power-supply line, wherein said second internal circuit outputs a second main signal to a second internal node when the second power supply potential is supplied to said second power-supply line, and said first internal circuit includes a fourth internal circuit for monitoring a potential of said second power-supply line to detect a power-off of said second power-supply line, and for supplying a second sub signal that decides a potential of said second internal node instead of said second main signal that becomes indefinite upon the power-off of said second power-supply line.

12. The semiconductor device according to claim 11, wherein said third internal circuit includes a first potential detection portion for monitoring the potential of said first power-supply line to detect the power-off of said first power-supply line, and a first switching circuit rendered conductive according to an output of said first potential detection portion for transmitting a first prescribed fixed potential as said first sub signal to said first internal node, and wherein said fourth internal circuit includes a second potential detection portion for monitoring the potential of said second power-supply line to detect the power-off of said second power-supply line, and a second switching circuit rendered conductive according to an output of said second potential detection portion for transmitting a second prescribed fixed potential as said second sub signal to said second internal node.

13. The semiconductor device according to claim 12, wherein said first switching circuit includes a first MOS transistor having one end connected to said first internal node and another end coupled to said first prescribed fixed potential, and having a gate receiving a potential controlled according to the output of said first potential detection portion;

said second switching circuit includes a second MOS transistor having one end connected to said second internal node and another end coupled to said second prescribed fixed potential, and having a gate receiving a potential controlled according to the output of said second potential detection portion;

said third internal circuit includes a third MOS transistor having one end connected to the gate of said first MOS transistor and another end coupled to said first prescribed fixed potential, and having a gate receiving a potential controlled according to the output of said second potential detection portion; and said fourth internal circuit includes a fourth MOS transistor having one end connected to the gate of said second MOS transistor and another end coupled to said second prescribed fixed potential, and having a gate receiving a potential controlled according to the output of said first potential detection portion.

14. A semiconductor device, comprising:

a first power-supply line provided to transmit a first power-supply potential;

a first internal circuit receiving and operating with said first power-supply potential from said first power-supply line for outputting a first main signal to a first internal node;

a second power-supply line provided to transmit a second power-supply potential; and a second internal circuit receiving and operating with said second power-supply potential from said second power-supply line, wherein said second internal circuit includes a third internal circuit for monitoring a potential of said first power-supply line to detect a power-off of said first power supply line and outputting a first sub signal that decides a potential of said first internal node instead of said first main signal that becomes indefinite upon the power-off of said first power-supply line, wherein said third internal circuit includes a first potential detection portion for monitoring a potential at a first point on said first power-supply line, a second potential detection portion for monitoring a potential at a second point on said first power-supply line, and a determination portion for determining an occurrence of the power-off of said first power-supply line according to outputs of said first and second potential detection portions.

15. The semiconductor device according to claim 14, wherein said determination portion determines the occurrence of the power-off of said first power-supply line when both of said first potential detection portion and said second potential detection portion detect the power-off of said first power-supply line.

* * * * *